United States Patent
An et al.

(10) Patent No.: US 11,337,332 B1
(45) Date of Patent: May 17, 2022

(54) LATCH WITH AUTO-CLOSE

(71) Applicant: ZT Group Int'l, Inc., Secaucus, NJ (US)

(72) Inventors: Chen An, Secaucus, NJ (US); Maheshkumar Varrey, Secaucus, NJ (US); Zichun Song, Secaucus, NJ (US)

(73) Assignee: ZT Group Intl, Inc., Secaucus, NJ (US)

( * ) Notice: Subject to any disclaimer, the term of this patent is extended or adjusted under 35 U.S.C. 154(b) by 92 days.

(21) Appl. No.: 17/084,874

(22) Filed: Oct. 30, 2020

(51) Int. Cl.
*H05K 7/14* (2006.01)
*H05K 5/02* (2006.01)

(52) U.S. Cl.
CPC ......... *H05K 7/1489* (2013.01); *H05K 5/0221* (2013.01)

(58) Field of Classification Search
CPC . G06F 1/187; A47B 2088/4235; A47B 88/43; H05K 7/1487; H05K 7/1488; H05K 7/1489; H05K 7/1474; H05K 7/183; H05K 5/0204; H05K 5/0208; H05K 5/0217; H05K 5/0221
See application file for complete search history.

(56) References Cited

U.S. PATENT DOCUMENTS

| | | | | |
|---|---|---|---|---|
| 6,398,041 B1* | 6/2002 | Abbott | ................. | H05K 7/1489 361/829 |
| 7,364,244 B2* | 4/2008 | Sandoval | ............. | H05K 7/1421 312/334.46 |
| 8,104,626 B2* | 1/2012 | Huang | ................... | A47B 88/43 211/26 |
| 8,602,225 B2* | 12/2013 | Lin | ........................ | A47B 88/43 312/334.4 |
| 9,717,333 B2* | 8/2017 | Chen | ..................... | H05K 7/1489 |
| 9,743,767 B1* | 8/2017 | Easton | ................ | H05K 7/1489 |
| 10,128,612 B1* | 11/2018 | Casto | ..................... | H01R 13/17 |
| 10,178,791 B1* | 1/2019 | Kho | ...................... | H05K 7/1487 |
| 10,376,055 B2* | 8/2019 | Chen | ..................... | H05K 7/183 |
| 10,485,133 B1* | 11/2019 | Revol | ................... | H05K 7/186 |
| 10,517,183 B1* | 12/2019 | Huang | ................ | H05K 7/1487 |
| 10,524,381 B1* | 12/2019 | Corbo | ................... | A47B 88/43 |
| 10,646,040 B2* | 5/2020 | Chen | ..................... | H05K 7/1489 |
| 10,765,028 B1* | 9/2020 | Beall | .................... | H05K 7/1489 |
| 10,869,404 B2* | 12/2020 | Yu | ........................ | H05K 7/1489 |
| 11,160,189 B2* | 10/2021 | Yu | .......................... | H05K 7/183 |
| 11,197,389 B2* | 12/2021 | Lin | ...................... | A47B 88/437 |
| 2011/0249950 A1* | 10/2011 | Chapa Ramirez | ... | H05K 7/1489 385/135 |
| 2012/0134743 A1* | 5/2012 | Yu | .......................... | A47B 88/43 403/330 |
| 2013/0241378 A1* | 9/2013 | Zhang | ................. | H05K 5/0221 403/327 |
| 2021/0186213 A1* | 6/2021 | Chen | ..................... | A47B 88/477 |
| 2021/0360807 A1* | 11/2021 | Yu | ........................... | G06F 1/186 |

* cited by examiner

*Primary Examiner* — Patrick D Hawn
(74) *Attorney, Agent, or Firm* — Dergosits & Noah LLP; Todd A. Noah (57) ABSTRACT

A latch includes a pin held in a set position by a trigger. The trigger, when depressed, allows the pin to extend from a chassis and engage a rack, preventing the chassis from being removed from the rack. A handle allows the pin to be retracted, with a reset catch maintaining the pin in the retracted position. The trigger, when released, dislodges the reset catch and the pin returns to the set position maintained by the trigger.

16 Claims, 12 Drawing Sheets

LATCH WITH AUTO-CLOSE

BACKGROUND

Often, a latch includes a leaf spring with the latch hook and spring made from the same piece of sheet metal, which is thin and sharp. Since, when used in server and rack situations, these latches are in the latched status unless manually compressed, any lack of attention during servicing can prove hazardous by, e.g., exposing optical fibers to sharp edges. In addition, some latches may feature close mechanisms that contain leaf spring latches where the latches snap into position after the server is slid in. These same latches then require a constant external force to be disengaged and remain unlatched during slide-out process. Other latches are not "true" auto-close latches if they depend on the user applying a force to release the latch and keep it released while sliding the chassis some distance before the close feature may trigger.

Thus, what is needed is a true auto-close latch that latches when the chassis is slid into position without requiring a user-applied activation force.

BRIEF DESCRIPTION OF THE DRAWINGS

The embodiments are illustrated by way of example and not limitation in the accompanying drawings, in which like references indicate similar elements, and in which.

DETAILED DESCRIPTION

In an embodiment, a "true" auto-close latching mechanism may be mounted and operated from either side of the front or rear of, e.g., a server chassis. The embodiment may be able to withstand loads of more than 100 lbs., which would be sufficient to secure a server chassis within a rack even during seismic impacts. In embodiments, the latch is a "true" auto close latch in that one gesture opens the latch. The latch then remains unlatched until the chassis is slid into place, which triggers the latch to close. In an embodiment, a spring-loaded pin (or bolt) module may include the load bearing component of the latch preventing removal (e.g., the pin or bolt preventing removal of the chassis) or the dislodging of the chassis (e.g., during impact). Cooperating with the pin module is a trigger module, which includes a pair of spring-loaded pieces (called "sliders", of, e.g., sheet metal or diecast metal) that, in an embodiment, create two unlatched states for the pin. In such an embodiment, one slider may retain the pin in a manual unlatched or "open" position, while the other slider may maintain the pin in a set or "impending close" or "cocked" position. The set position is also an unlatched position. However, in the set position, the auto-close feature may be triggered when the chassis is slid into the rack, and without the latch itself being manipulated by the user. Thus, embodiments disclose a "true" auto-close latch that eliminates the need to have a user continually exert a force to unlatch the latch and hold the latch in advance of sliding the chassis into the rack.

In addition, various embodiments of the latch may be mounted on either side of the rear or front of a chassis. In an embodiment, the latch may have the latch pin recessed inside the chassis keeping it from grabbing on to any exposed cables.

Figure 1:
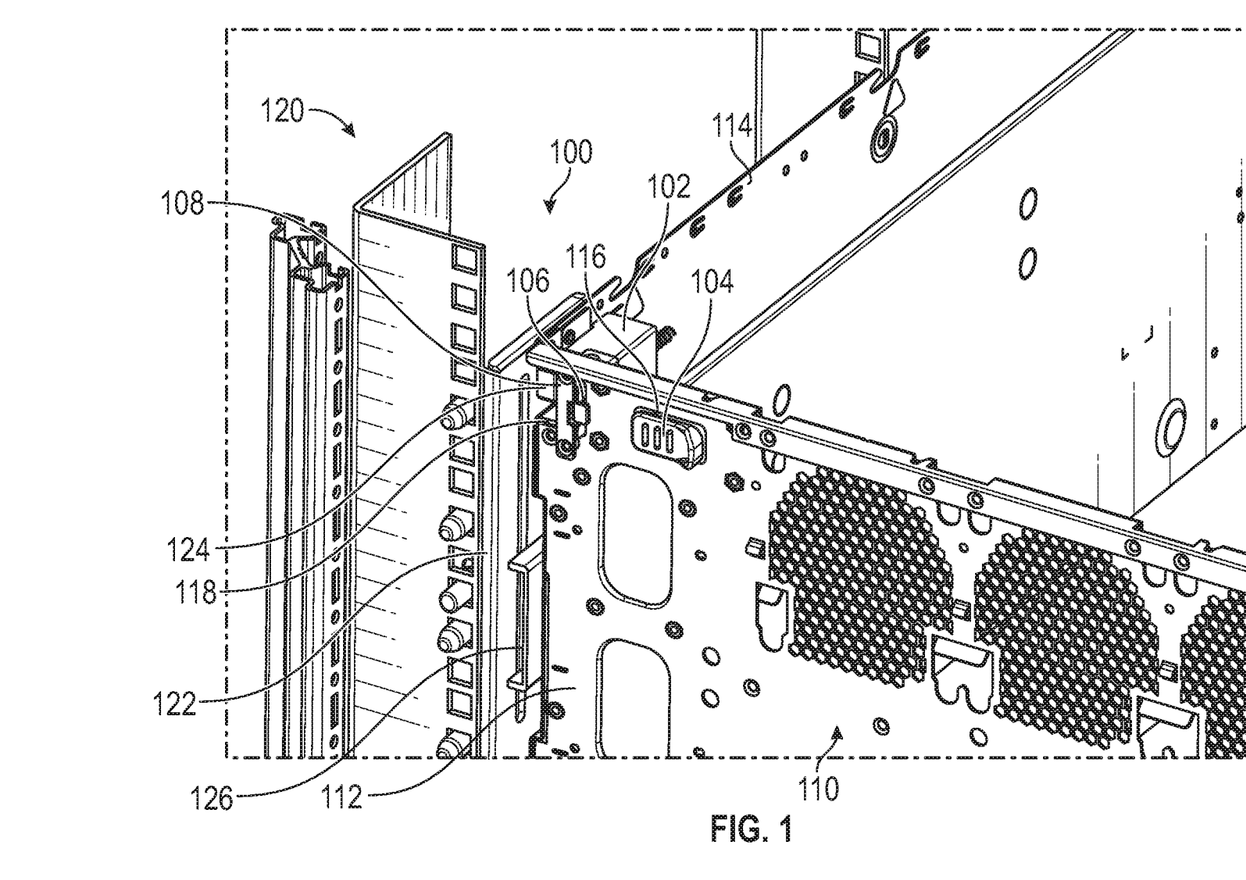
FIG. 1 is a partial upper right rear perspective view of a server employing an embodiment of an auto-close latch and mounted within a server rack.
Figure 3:
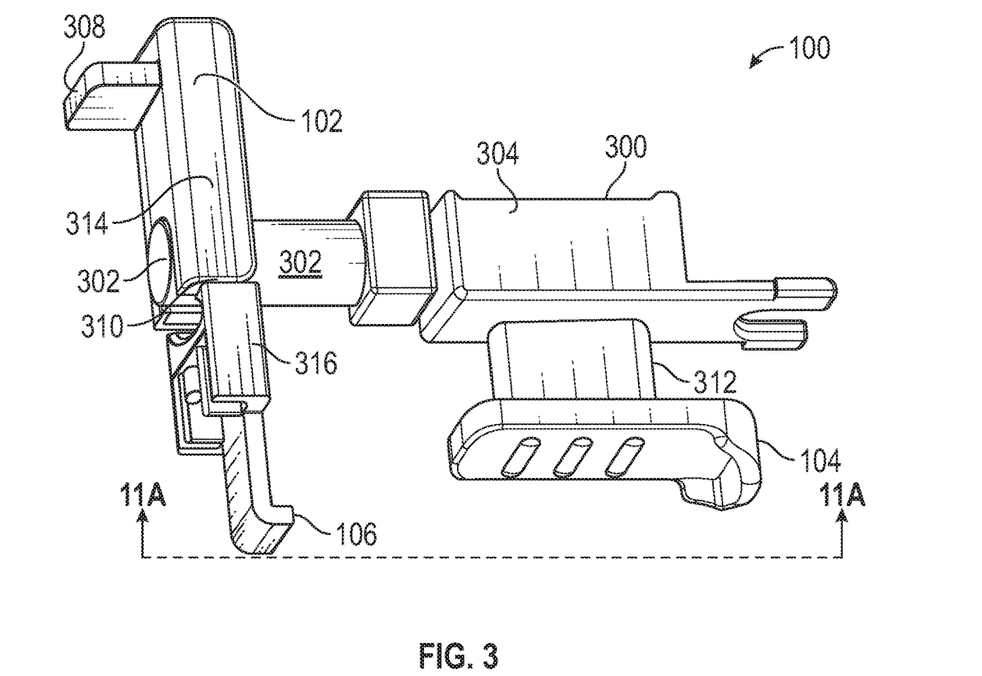
FIG. 3 is an upper left perspective view of internal elements of the embodiment of the auto-close latch of FIG. 1.

FIG. 1 is a partial upper right rear perspective view of a server chassis 110 employing an embodiment of an auto-close latch 100. Chassis 110 is mounted within a server rack 120. The discussion of FIG. 1 through FIG. 12 regards a latch mounted on a left corner of chassis 110, but the discussion applies equally to a similar, mirror-image versions of the latch configured for a right corner of chassis 110. In FIG. 1, latch 100 is in the latched configuration, which will be discussed further with respect to FIG. 11B. In FIG. 1, server rack 120 includes a rail bracket 122 with a rail 126. Latch 100 includes a trigger module 102 and a pin module 300 (FIG. 3). Trigger module 102 is attached to a chassis side 114 and includes a clip 108 and a hook 106 (seen protruding from a window 118 of chassis rear 112). Clip 108 and hook 106 will be illustrated further with regard to, e.g., FIG. 7-FIG. 10. Pin module 300 (FIG. 3) includes a handle 104 (seen protruding from a window 116 of chassis rear 112).

The latching of chassis 110 within rack 120 is accomplished by sliding chassis 110 along rail 126 until latch 100 is triggered by rail stop 124 affixed to rack rail bracket 122. The triggering of latch 110 occurs when chassis 110 slides along rail 126 and rail stop 124 prevents a trigger 308 (FIG. 3) from moving further, which causes a relative movement in the reverse direction of chassis travel of trigger 308 with respect to the rest of latch 100. The relative movement triggers latch 100. The triggering causes a pin 302 (FIG. 3) to slide toward rail stop 124 and emerge from clip 108 behind a rail stop face 202 (FIG. 2), which prevents chassis 110 from being slid forward and withdrawn from rack 120.

Figure 2:
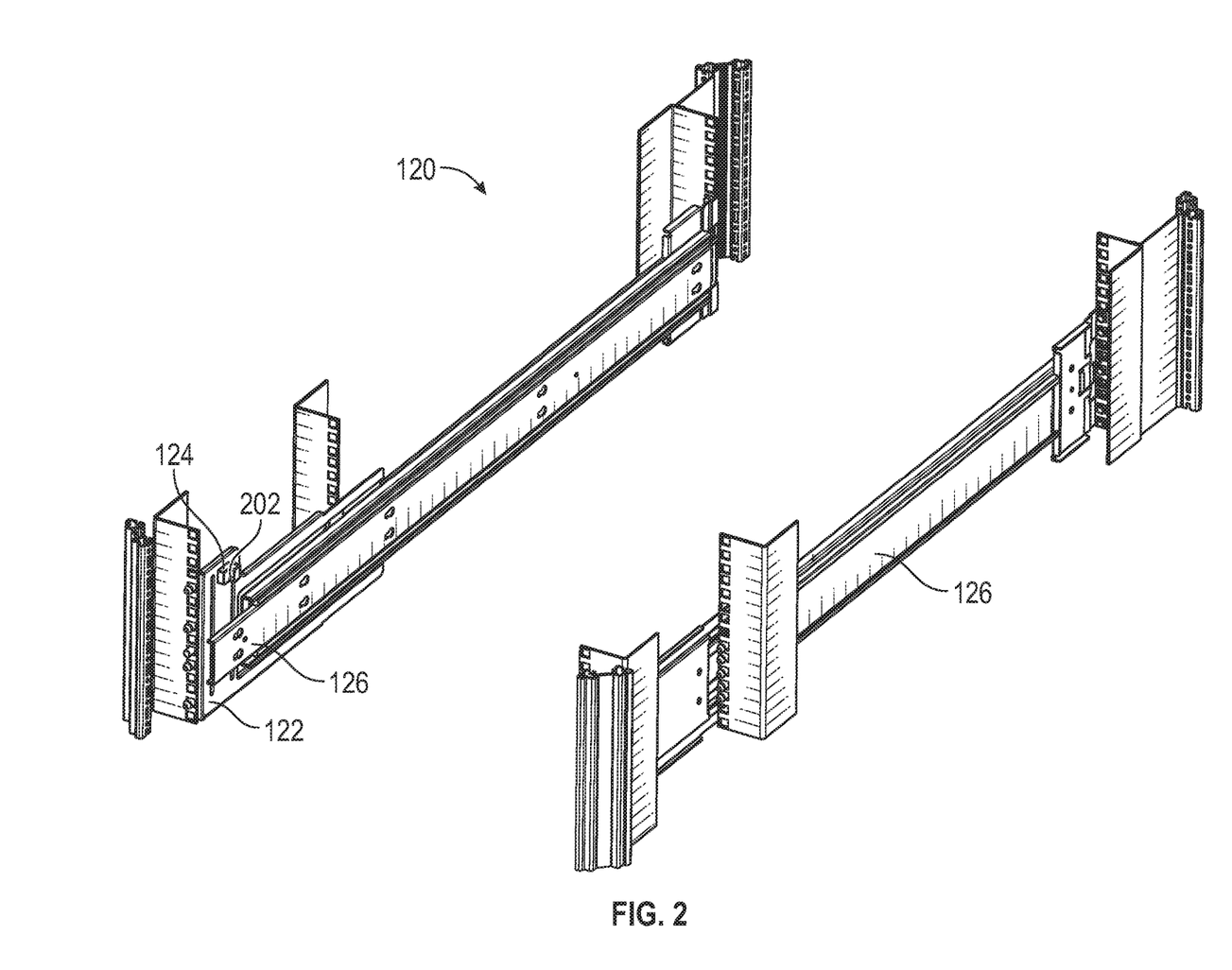
FIG. 2 is a partial upper right rear perspective view of a server rack and related elements of the embodiment of the auto-close latch of FIG. 1.

FIG. 2 is a partial upper right rear perspective view of server rack 120 and related elements of the embodiment of latch 100 of FIG. 1. In FIG. 2, rail stop 124 is shown to include stop face 202 on an extended section of rail stop 124. It is face 202 that hinders forward movement of pin 302 (FIG. 3). FIG. 2 also illustrates that rack 120 further includes a rail 126 which could be equipped with a symmetric version of rail stop 124 for an embodiment of latch 100 configured for a right rear corner of chassis 110.

FIG. 3 is an upper left rear perspective view of internal elements of the embodiment of the auto-close latch 100 of FIG. 1. In FIG. 3, latch 100 is in a "set" or "cocked" configuration in which pin 302 is withdrawn into chassis 110, which will be discussed further with respect to FIG. 11A. As stated, latch 100 includes trigger module 102 and pin module 300. Pin module 300 includes pin 302, a spring housing 304 with a neck 312 that extends through chassis 110 and connects to handle 104. Pin module 300 further includes a spring 402 (FIG. 4) that biases pin module 300 toward the extended and latched configuration. From the set position shown, when triggered, pin 302 is forced laterally ("left" as shown) by spring 402 and emerges from trigger module 102 to assume the extended, latched configuration. In doing so, pin module 300 moves as one unit. Trigger module 102 includes a tab (or "trigger") slider 314 and a reset (or "hook") slider 316. Trigger module 102 further includes a spring 710 (FIG. 7) that biases tab slider 314 toward pin 302, and a spring 706 (FIG. 7) that biases reset slider 316 toward pin 302. From the set position shown, with rearward movement of chassis 110, trigger tab 308 will contact stop 124 of rack 120 and be moved forward ("up" as shown), which correspondingly moves tab slider 314 forward ("up"). With the forward movement of tab slider 314, pin 302 is released, allowing it to move laterally. When latch 100 is in the set position, tab slider 314 includes a contact point 310 against reset slider 316. Forward movement of tab slider 314 allows reset slider 316 to move forward until reset slider 316 abuts pin 302. In contrast to pin module 300, trigger module 102 does not necessarily move as a unit. Hook 106 of reset slider 316 allows a user to manually move reset slider 316 rearward ("down" as shown). In the case of an unintentional unlatching (e.g., where after a proper latching, handle 104 was moved to the unlatched position), a user may use hook 106 to move reset slider 316 rearward, which releases pin 302 from the unlatched position, allowing pin 302 to extend and re-latch.

Figure 4:
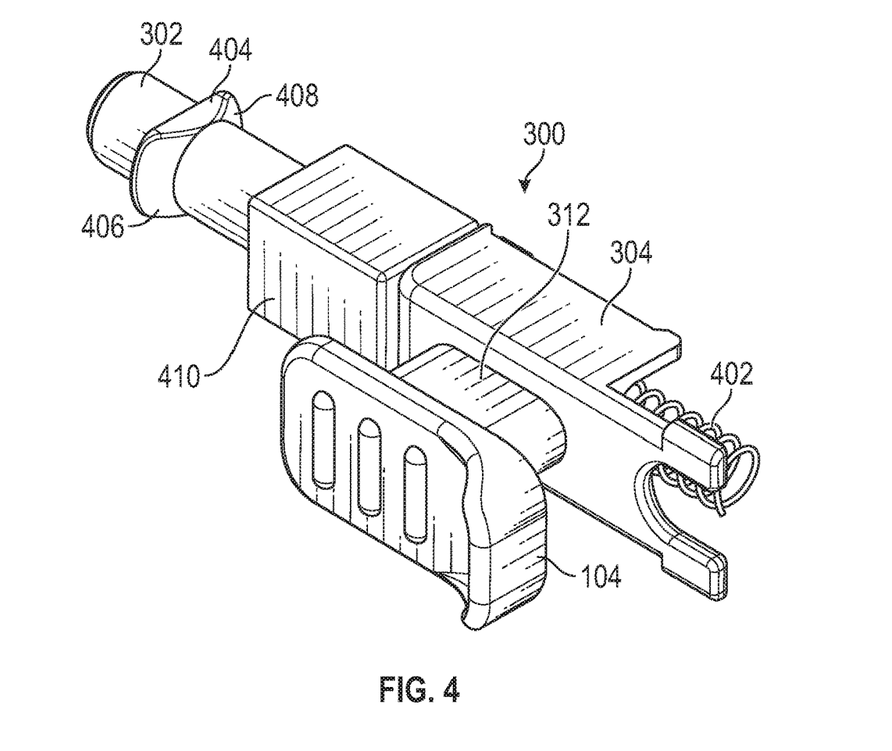
FIG. 4 is an upper left rear perspective view of internal elements of the embodiment of the auto-close latch of FIG. 1.

FIG. 4 is an upper right rear perspective view of internal elements of pin module 300 of latch 100 of FIG. 1. In FIG. 4, pin module 300 includes spring 402, which when compressed urges pin module (particularly pin 302) to the extended, latched position. Pin module 300 further includes a chamfer 408 and a chamfer 406 on a somewhat annular ridge 404 about pin 302. In the embodiment, pin 302 includes a squared section 410, which transitions to a cylindrical section. As will be discussed further, a lip 1102 (FIG. 11A) of chamfer 408 interacts with tab slider 314 to hold pin module 300 in the set position and a lip 1104 (FIG. 11A) of chamfer 406 interacts with reset slider 316 to hold pin module in the fully unlatched position.

Figure 5:
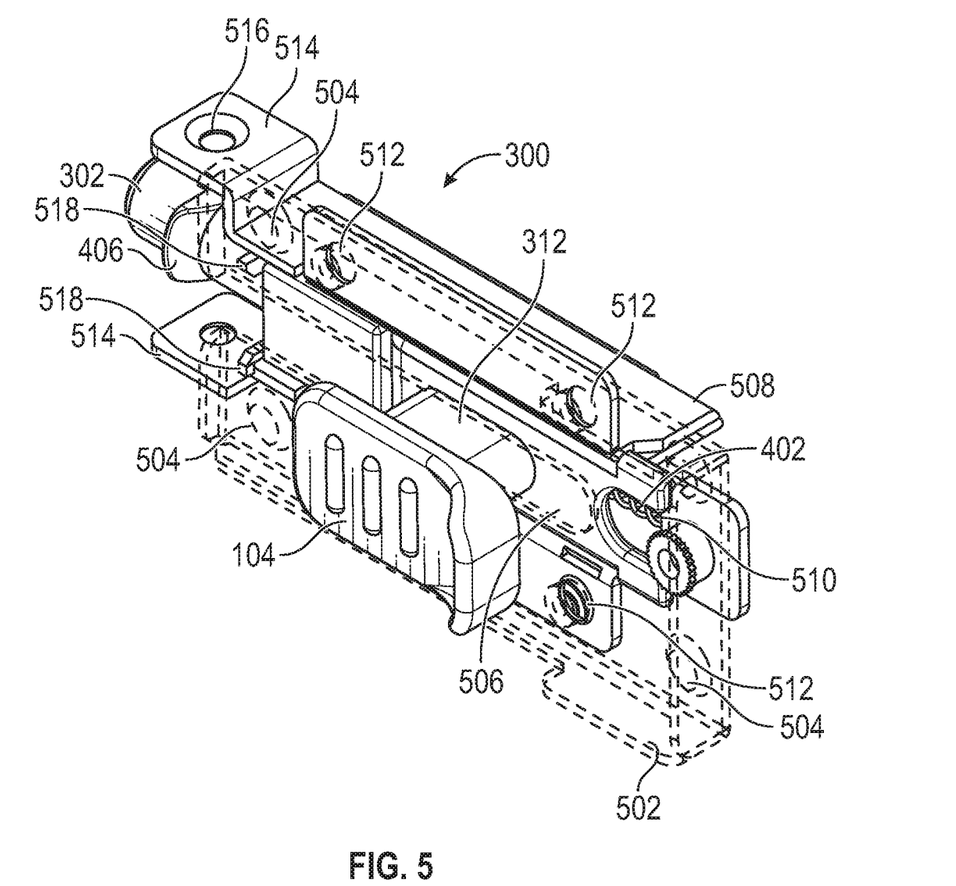
FIG. 5 is a partially-transparent, upper left rear perspective view of internal elements of the embodiment of the auto-close latch of FIG. 1.

FIG. 5 is a partially-transparent, upper right rear perspective view of internal elements of the embodiment of the auto-close latch of FIG. 1. In FIG. 5, pin module 300 is shown to further include a mounting bracket 502 and a mounting bracket 504 with pin 302 and spring housing 304 sandwiched between. Spring 402 is compressed between spring housing 304 and a spring seat 510 of bracket 508, providing a force that biases pin 302 toward the extended position. Holes 512 are provided for affixing bracket 508 to bracket 502, and holes 504 are provided for attaching pin module 300 to chassis rear 112. As assembled, neck 312 moves laterally within a slot 506 corresponding to a user moving handle 104 or pin 302 extending after being triggered. The extension of pin 302 may be limited by squared section 410 abutting a pin stop 518 of mounting bracket 508. In the embodiment, pin module 300 is attached to trigger module 102 using mounting holes 516 formed in connections flanges 514.

Figure 6:
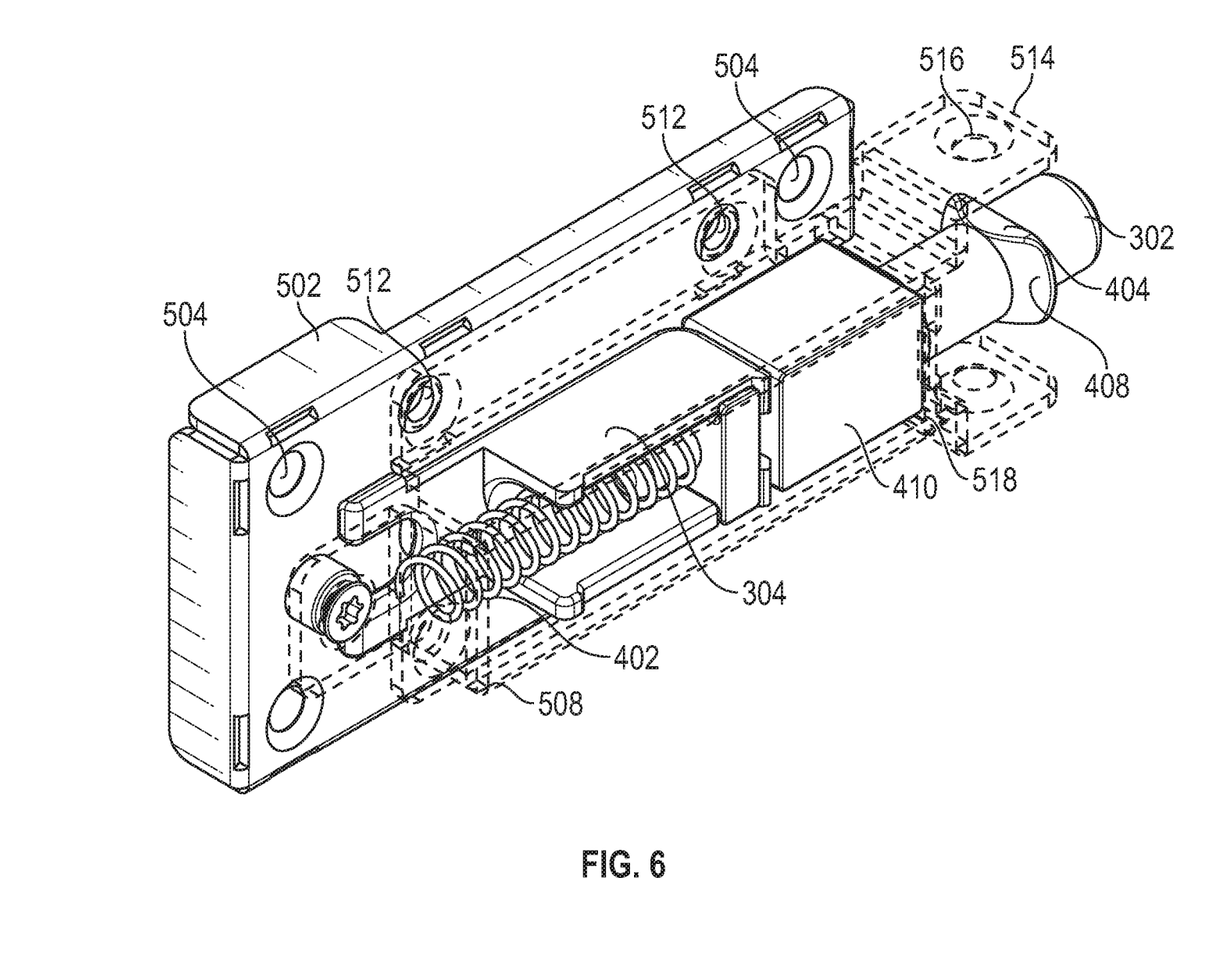
FIG. 6 is a partially-transparent, upper left front perspective view of internal elements of the embodiment of the auto-close latch of FIG. 1.

FIG. 6 is a partially-transparent, upper left front perspective view of internal elements of the embodiment of latch 100 of FIG. 1. In FIG. 6, squared section 410 and spring housing 304 are shown to be configured to slide within mounting bracket 508. By conforming to the inner dimensions of bracket 508, squared section 410 and spring housing 304 resist rotation of pin 302 about a longitudinal axis. This constraint, and that of neck 312 within slot 506, maintain the orientation of chamfers 406, 408 so that they are associated with reset slider 316 and trigger slider 314, respectively.

Figure 7:
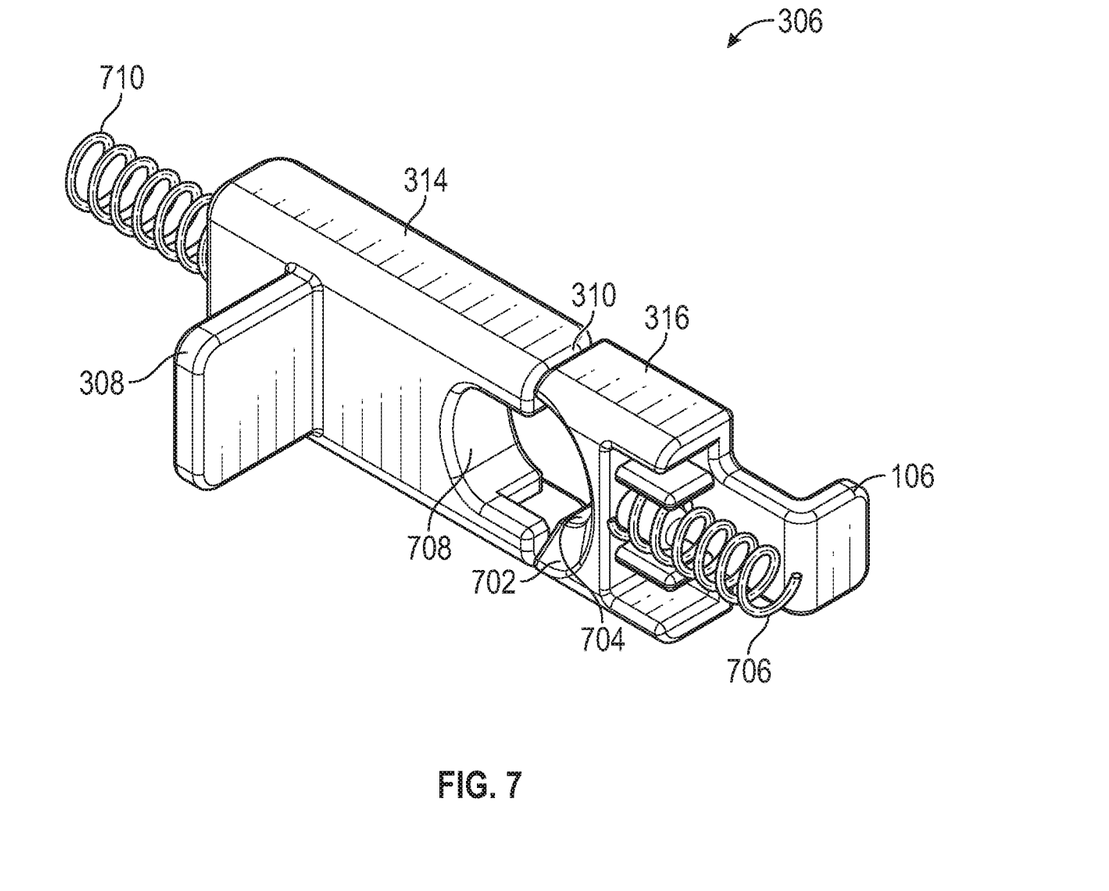
FIG. 7 is an upper left rear perspective view of internal elements of the embodiment of the auto-close latch of FIG. 1.

FIG. 7 is an upper right front perspective view of internal elements of the embodiment of latch 100 of FIG. 1. In FIG. 7, spring 710 is associated with tab slider 314 and spring 706 is associated with reset slider 316. In the embodiment, the force of spring 710 is configured to be greater than that of spring 706 at all times. Thus, in the absence of outside forces, and with pin 302 withdrawn, sliders 314, 316 will be pushed toward the set position, which is rearward in FIG. 7. FIG. 7 shows reset slider 316 to have a pin recess 704 and a reset bevel 702. Tab slider 314 includes a pin recess 708. Pin recesses 704, 708 are configured to allow pin 302 to pass between and also allow for both sliders to attain their set positions and unlatched positions (to be discussed with reference to FIG. 11A-FIG. 11C) Reset bevel 702 provides a ramp against which chamfer 406 may work when pin 302 is moved to the unlatched position. When pin 302 is moved to the unlatched position, reset bevel 702 and chamfer 406 cooperating to push reset slider 316 rearward and allow pin 302 to be moved from the extended position to the unlatched without a user having to manually move reset slider 316 rearward at the same time.

Figure 8:
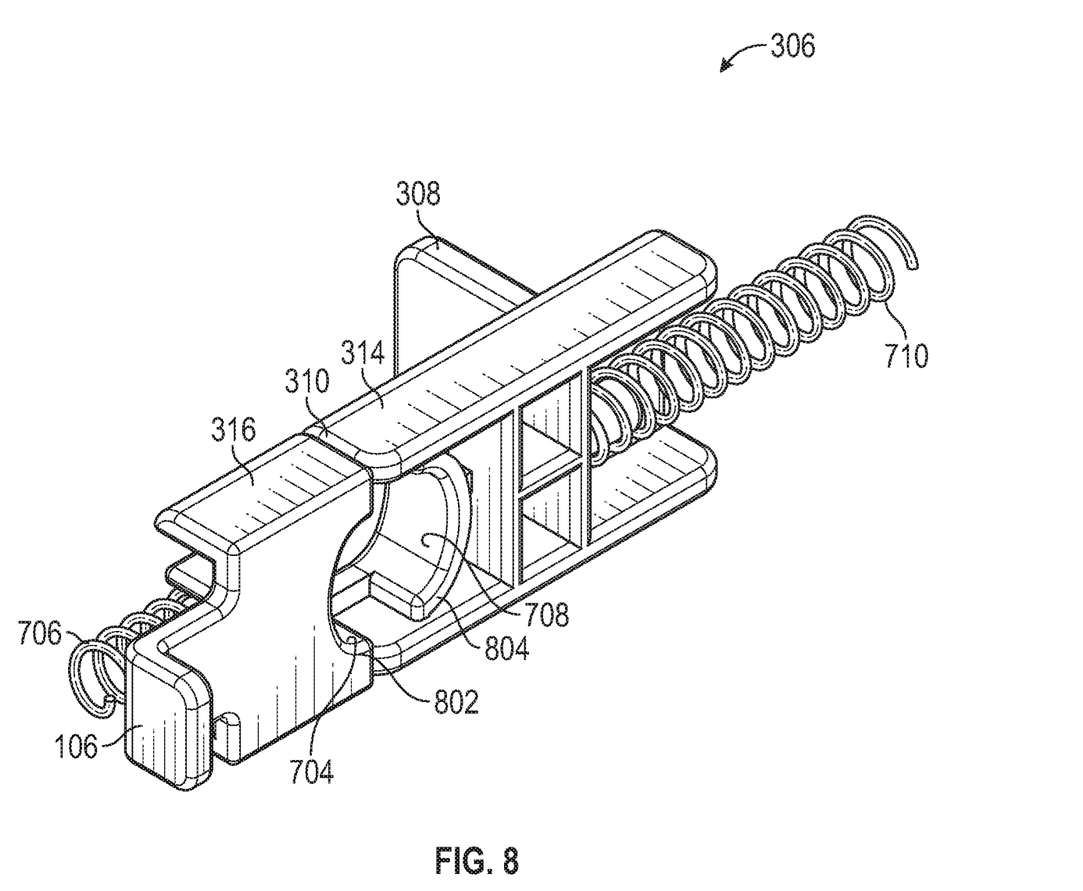
FIG. 8 is an upper right rear perspective view of internal elements of the embodiment of the auto-close latch of FIG. 1.

FIG. 8 is an upper right rear perspective view of internal elements of the embodiment of latch 100 of FIG. 1. In FIG. 8, reset slider 316 is shown to include a lip seat 802 and trigger slider 314 is shown to include a lip seat 804. In the unlatched position (shown in FIG. 11C), lip seat 802 cooperates with lip 1104 of pin 302 to maintain pin 302 in the unlatched position. In the set position (shown in FIG. 11A), lip seat 804 cooperates with lip 1102 of pin 302 to maintain pin 302 in the set position.

Figure 9:
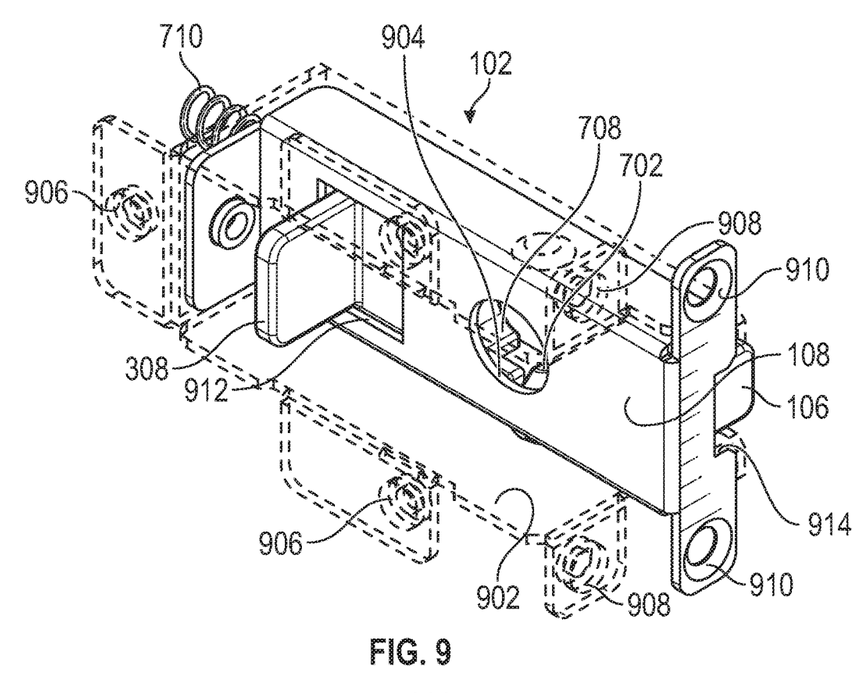
FIG. 9 is a partially-transparent upper left rear perspective view of internal elements of the embodiment of the auto-close latch of FIG. 1.

FIG. 9 is a partially-transparent upper left rear perspective view of internal elements of the embodiment of latch 100 of FIG. 1. In FIG. 9, trigger module 102 is shown to include a trigger housing 902. Tab slider 314 and reset slider 316 are sandwiched between trigger housing 902 and clip 108 such that trigger tab 308 protrudes from a tab window 912 and hook 106 is accessible from the rear, extending through a hook window 914. Trigger tab 308 moves within window 912 between a forward (depressed, or triggered) position and a set position, in which tab slider abuts pin 302. As shown, trigger tab 308 is in the forward, depressed, or triggered position. Clip 108 includes a pin hole 904 through which pin 302 moves to attain the extended, latched position. Clip 108 further includes mounting holes 910 and trigger housing further includes mounting holes 906 (for mounting to chassis side 114) and 908 (for mounting to chassis rear 112). In the embodiment, the offset between holes 908 and 910 allows for chassis rear 112 to be sandwiched between them. As attached as shown to both chassis rear 112 and chassis side 114 and with pin hole 904 configured to allow pin 302 pass through, but not move appreciably forward or rearward, trigger module 102 assists in limiting pin 302 to movement along its longitudinal axis, which reinforces the retaining force of the latch.

Figure 10:
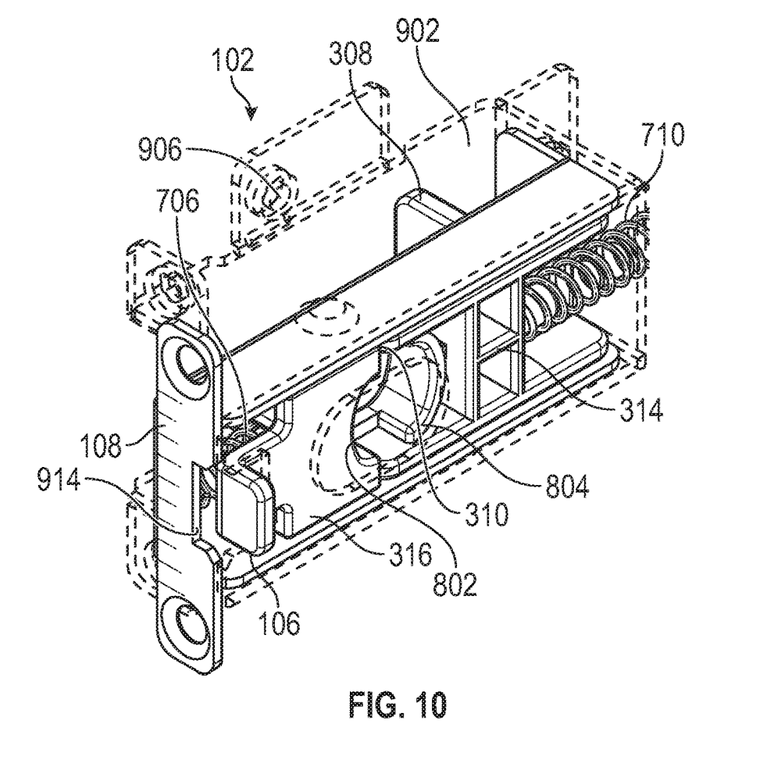
FIG. 10 is a partially-transparent upper right rear perspective view of internal elements of the embodiment of the auto-close latch of FIG. 1.

FIG. 10 is a partially-transparent upper left rear perspective view of internal elements of the embodiment of latch 100 of FIG. 1. In FIG. 10, it can be seen that trigger housing 902 is recessed within chassis 110, since mounting holes 906 attach to the inner side of chassis side 114 (See FIG. 1). Thus, by adapting chassis 110 to accommodate latch 100, rail stop 124 and rail bracket 122 may be attached to rack 120 without other modification of rack 120 (e.g., there is no need to widen the distance between vertical rack components or otherwise create windows to allow passage of trigger module 102 when chassis 110 is slid into rack 120).

In embodiments, with appropriate, minor modifications to the housings and mounting brackets, latch 100 may be mounted to the rear top corner or rear bottom corner of a chassis without departing from this disclosure. Similarly, in embodiments as discussed with regard to FIG. 1 through FIG. 12, latch 100 may be mounted to the front top corner or front bottom corner of a chassis without departing from this disclosure.

Figure 11A:
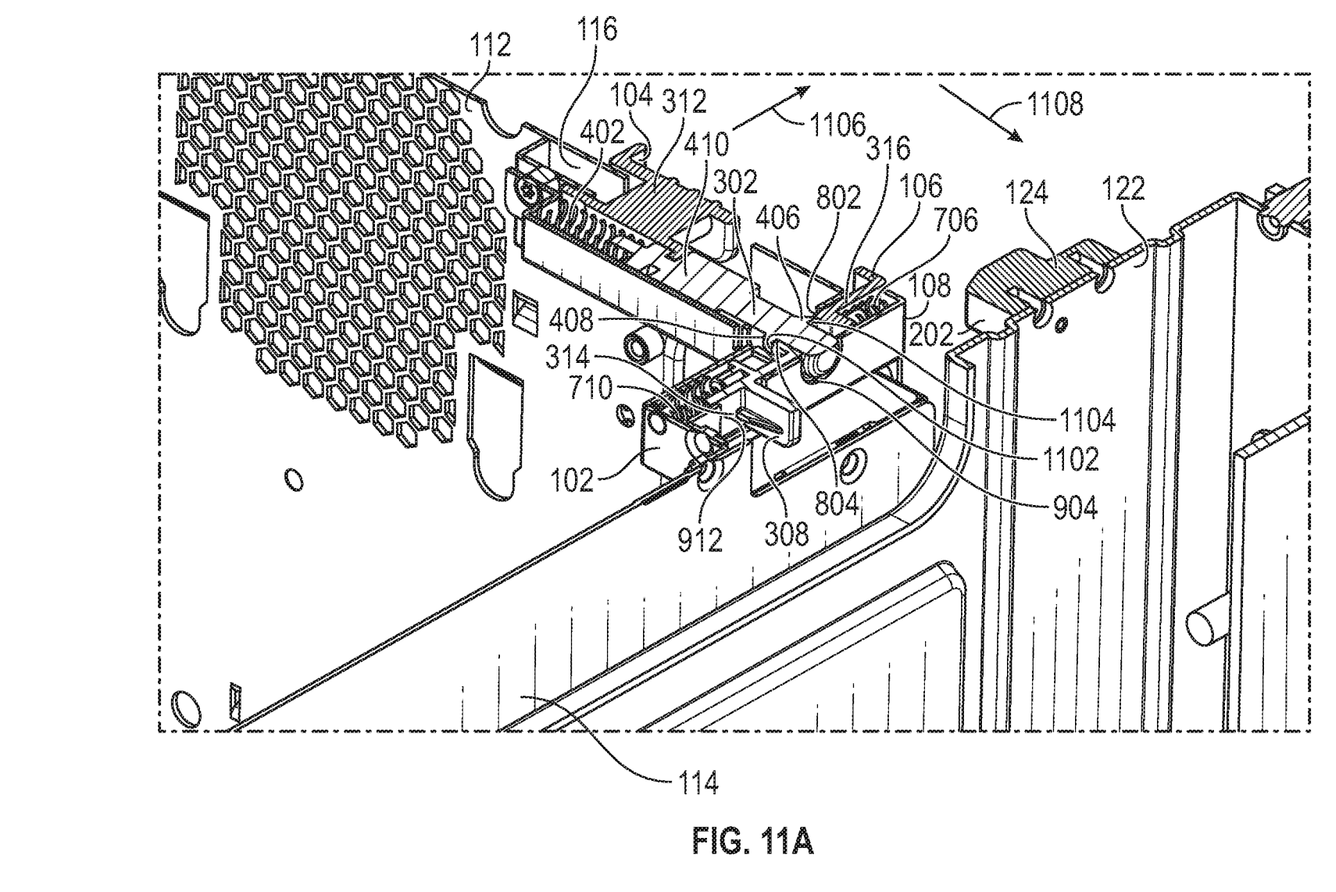
FIG. 11A is a sectional view of the embodiment of the auto-close latch of FIG. 1 in an impending close position as indicated by the section in FIG. 3.

FIG. 11A is an upper left front sectional view of the embodiment of latch 100 of FIG. 1 in an impending close position as indicated by the section in FIG. 3. FIG. 11A shows latch 100 in the set or cocked position. Chassis 110 is being slid in rearward direction 1106 toward rail stop 124. In the set position, lip 1102 of pin 302 is forced by compressed spring 402 in direction 1108 against lip seat 804 of trigger tab slider 314. Trigger tab slider 314 is forced by compressed spring 710 in direction 1106 against pin 302. As stated, the force of spring 710 is greater than that of spring 706. In this set position, trigger tab slider 314 contacts reset slider 316 at contact face 310 (see FIG. 3) and pushes reset slider 316 in rearward direction 1106. With tab slider 314 moved rearward, lip seat 802 is not positioned to hinder the travel of lip 1104 of pin 302. In other words, in the set position, the extension of pin 302 is prevented by lip seat 804 of tab slider 314 and not by lip seat 802 of reset slider 316.

Figure 11B:
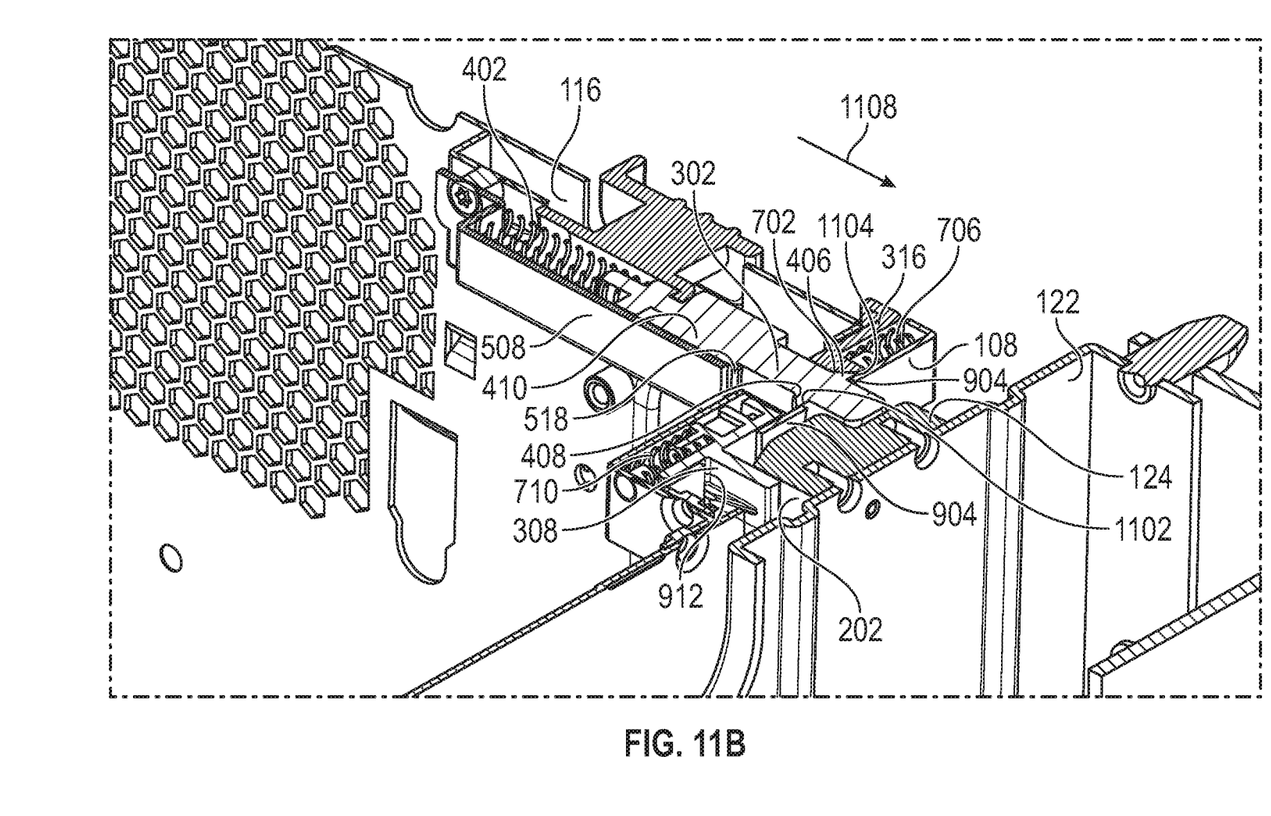
FIG. 11B is a sectional view of the embodiment of the auto-close latch of FIG. 1 in a latched position as indicated by the section in FIG. 1.

FIG. 11B is an upper left front sectional view of the embodiment of latch 100 of FIG. 1 in a latched position as indicated by the section in FIG. 1. FIG. 11B shows latch 100 in the latched or "triggered" position and chassis 110 in the final, installed position. To achieve the latched position, chassis 110 has been slid rearward in direction 1106 (FIG. 11A) causing stop face 202 to initially contact and then move trigger tab 308 and tab slider 314 forward with respect to pin 302. This triggering is caused by the motion of chassis 110 and without the user manually activating latch 100. The relative motion between tab slider 314 and pin 302 is the trigger that unseats pin lip 1102 from lip seat 804, allowing spring 402 to push pin 302 in direction 1108 until pin 302 is in the extended, latched position. In the latched position, lips 1102, 1104 are seated against the edge of clip 108, which prevents further extension of pin 302. In the latched position, pin 302 is behind rail stop 124, preventing forward motion of pin 302 and, consequentially, chassis 110. In this manner, latch 100 latches chassis 110 into rack 120.

In the latched position, trigger tab slider 314 is forced forward and spring 710 is compressed. Thus, spring 706 is no longer overcome by spring 710 and reset slider 316 is pushed by spring 706 until reset slider 316 abuts pin 302, with chamfer 406 contacting reset bevel 702. In this position, latch 100 may be unlatched by a user moving handle 104 to compress spring 402 and withdraw pin 302. The movement to the unlatched position causes the ramp of chamfer 406 to work against the ramp of reset bevel 702 and force reset slider 316 rearward (reset slider 316 is constrained to fore/aft movement by clip 108 and housing 902).

Figure 11C:
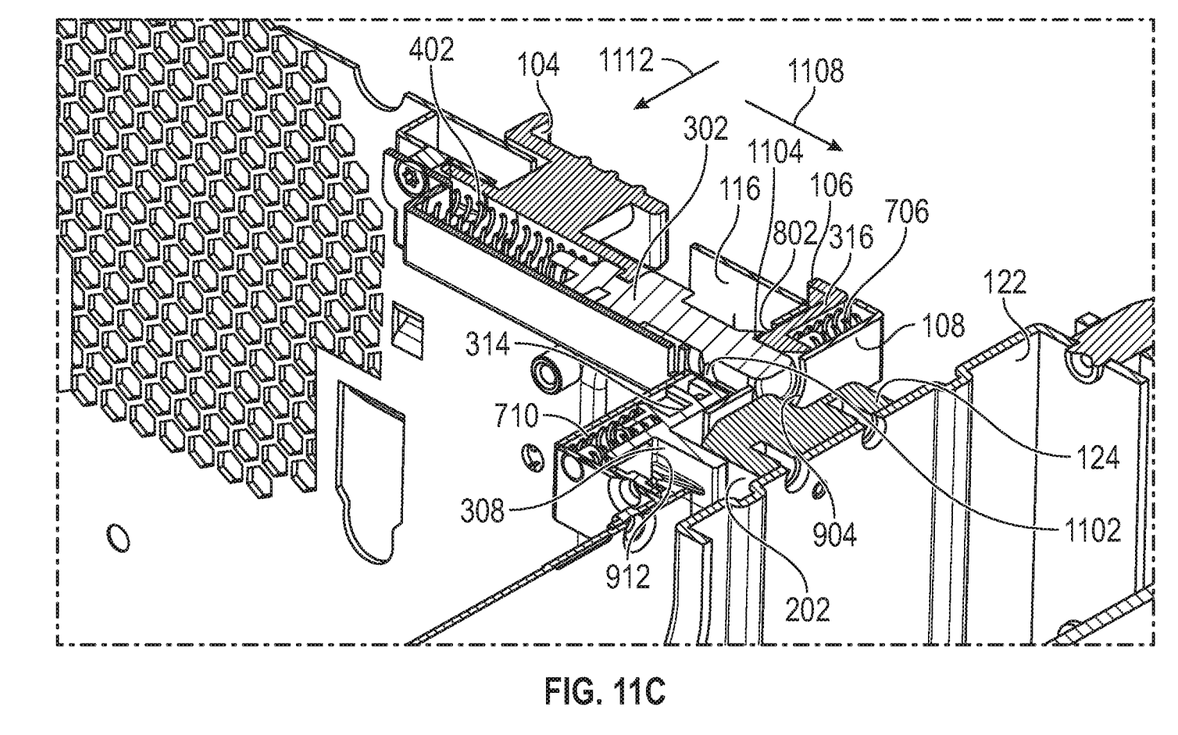
FIG. 11C is a sectional view of the embodiment of the auto-close latch of FIG. 1 in an unlatched position in the same plane as that indicated by the sections in FIG. 1 and FIG. 3.

FIG. 11C is an upper left front sectional view of the embodiment of latch 100 of FIG. 1 in an unlatched position in the same plane as that of FIG. 11B, but with a fully retracted pin 302. In comparison, in FIG. 11A, pin 302 is slightly less retracted because in FIG. 11A, pin 302 abuts lip seat 804 of trigger slider 314, which is slightly offset toward clip 108 compared to lip seat 802 of reset slider 316. In FIG. 11C, pin 302 has been retracted fully, e.g., by a user moving handle 104 in the direction opposite 1108. Such movement retracts pin 302 within clip 108 and compresses spring 402 further. During the movement, chamfer face 406 rides up bevel 702 and past reset slider 316. When chamfer face 406 clears reset slider 316 in direction 1110, spring 706 forces reset slider 316 back against pin 302. Handel 104 may then be released and pin 302 will be retained in the completely retracted position by lip 1104 of pin 302 abutting lip seat 802 of reset slider 316. With pin 302 fully retracted and no longer behind stop 124, chassis 110 may be slid forward in direction 1112 to be, e.g., removed from rack 120. With regard to FIG. 11C, it should be noted that when chassis 110 is slid forward from the position shown, tab 308 will travel rearward (relatively to chassis 110) with rail stop face 202 until tab slider 314 abuts pin 302. This rearward movement eventually causes tab slider 314 to contact reset slider 316 at contact point 310 (FIG. 3) at which point the greater force of spring 710 overcomes that of spring 706 to push reset slider 316 rearward. When reset slider 316 has traveled rearward the length of lip 1104, lip seat 802 no longer hinders the movement of pin 302. Pin 302 is then extended by spring 402 until lip 1102 seats against lip seat 804. At this point pin 302 has returned to the set or cocked position of FIG. 11A.

A feature of hook 106 is that when pin 302 is in the completely retracted position, a user may pull hook 106 to release pin 302. Thus, with regard to FIG. 11C, if pin 302 had been pre-maturely retracted, a user may pull hook 106 and spring 402 would push pin 302 to the extended, latched position.

Figure 12:
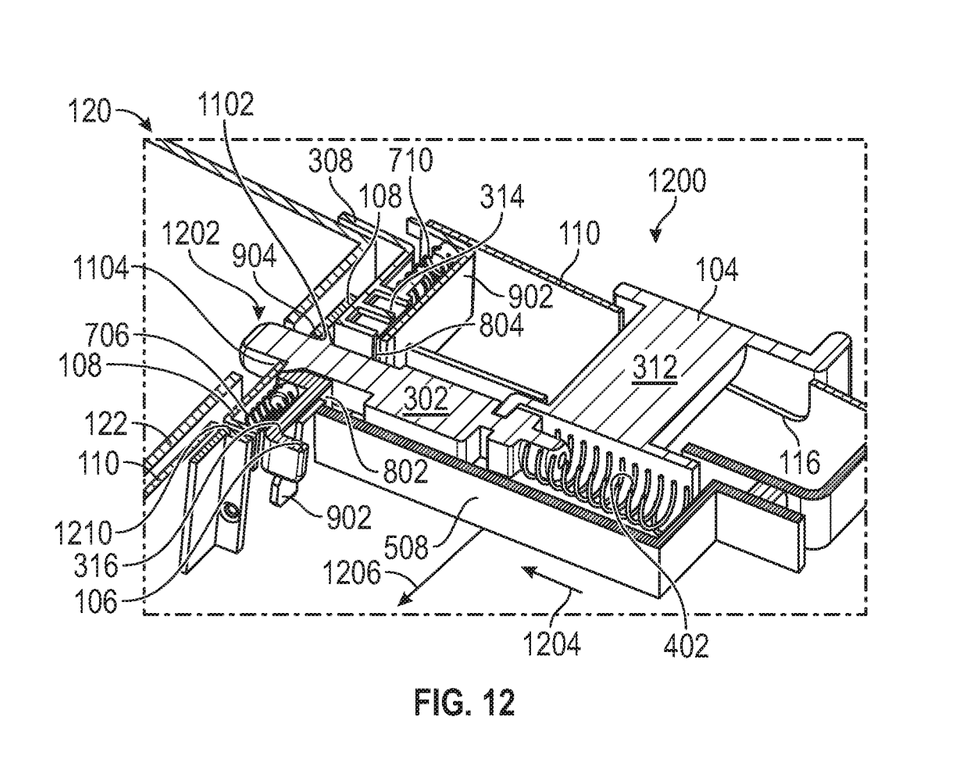
FIG. 12 is a sectional view of an embodiment of an auto-close latch.

FIG. 12 is an upper right rear sectional view of an embodiment of an auto-close latch 1200 mounted on the front of chassis 110. As shown in FIG. 12, latch 1200 employs many of the same elements as latch 100 and the previous descriptions of those elements and their interaction is incorporated into this discussion of latch 1200 unless it conflicts with the front-mounted configuration of latch 100. The main differences between latch 1200 and latch 100 lie in latch 1200 being configured for use at the front of chassis 110 so that, with latch 1200, trigger tab slider 308 is activated by contact with rack 120 as chassis 110 is slid in rearward direction 1206 and into rack 120. In FIG. 12, latch 1200 is shown in the latched position with pin 302 extending in direction 1204 through pin hole 904 and through a hole 1202 off rack rail bracket 122. This corresponds to the latched configuration of FIG. 11B (except for the forward mounted aspects) in that: pin 302 is extended by spring 402 with lips 1102, 1104 abutting the edge of pin hole 904; pin 302 as extended prevents chassis 110 from being withdrawn from rack 120 due to elements of rack 120 impeding forward movement of pin 302; tab 308 is moved forward by elements of rack 120 (the rack corner instead of rail stop 124), compressing spring 710. Reset slider 316 is urged forward by spring 706 to abut pin 302.

From the latched configuration of FIG. 12, latch 1200 may be placed in the fully retracted, unlatched position (similar to FIG. 11C) by moving handle 104 in the reverse of direction 1204 and retracting pin 302. Such movement retracts pin 302 within clip 108 and compresses spring 402 further. During the movement, chamfer face 406 rides up bevel 702 and past reset slider 316. When chamfer face 406 clears reset slider 316, spring 706 forces reset slider 316 back against pin 302. Handel 104 may then be released and pin 302 will be retained in the completely retracted position by lip 1104 of pin 302 abutting lip seat 802 of reset slider 316. With pin 302 fully retracted and no longer within hole 1202, chassis 110 may be slid forward in the reverse of direction 1206 to be, e.g., removed from rack 120.

With regard to FIG. 12, it should be noted that when pin 302 is in the fully retracted position and chassis 110 is slid forward from the position shown, tab 308 will travel backwards with the rack edge until tab slider 314 abuts pin 302. This rearward movement eventually causes tab slider 314 to contact reset slider 316 at contact point 310 (FIG. 3) and the greater force of spring 710 overcomes that of spring 706 to push reset slider 316 rearward. When reset slider 316 has traveled rearward the length of lip 1104, lip seat 802 no longer hinders the movement of pin 302. Pin 302 is then pushed by spring 402 until lip 1102 is seated against lip seat 804. At this point pin 302 has returned to the set or cocked position, similar to that described with reference to FIG. 11A.

In the discussion of FIG. 12 and latch 1200 some of the details for attaching latch 1200 to chassis 110 have been omitted for clarity though one of skill would realize that only minor modifications of the mounting of latch 100 would be necessary to mount latch 1200.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
    a pin movable along a first axis between an extended position and a retracted position, the pin being biased toward the extended position, the pin including a first protrusion and a second protrusion;
    a trigger movable along a second axis between a first depressed position and a first set position and biased toward the first set position with a first biasing force, the trigger including a first section, a first seat positioned to receive the first protrusion and a second section; and
    a catch movable along the second axis between a second depressed position and a second set position and biased toward the second depressed position with a second biasing force less than the first biasing force, the catch including a second seat positioned to receive the second protrusion and a third seat positioned to receive the second section;
    wherein:
    in a set configuration, the pin is in a disengaged position between the extended and retracted positions and at least partially recessed relative to the catch, the trigger is in the first set position, the first seat abuts the first protrusion thereby preventing the pin from moving to the extended position, the second section abuts the third seat, and the first biasing force overcomes the second biasing force and maintains both the trigger in the first set position and the catch in the second set position;
    in a latched configuration, the pin is in the extended position and extended relative to the catch, the trigger is in the first depressed position, and the catch is in the second depressed position; and
    in a released configuration, the pin is in the retracted position, the catch is in the second depressed position, the second protrusion abuts the second seat thereby preventing the pin from moving to the disengaged position.

2. The apparatus of claim 1, wherein:
    the second axis is oriented fore and aft with respect to a chassis and the first protrusion extends forward along the second axis from the pin and the second protrusion extends rearward from the pin.

3. The apparatus of claim 2, further comprising a stop attached to a rack, wherein:
    in the latched configuration, the stop abuts the trigger thereby maintaining the trigger in the first depressed position and the stop is positioned between the trigger and the pin such that motion of the pin forward is limited by the stop.

4. The apparatus of claim 3, wherein:
    in the unlatched configuration, the stop abuts the trigger thereby maintaining the trigger in the first depressed position with the trigger distanced from the catch such that the second section does not abut the third seat.

5. The apparatus of claim 1, further comprising a first spring creating the first biasing force, a second spring creating the second biasing force, and a third spring biasing the pin toward the extended position.

6. The apparatus of claim 1, wherein the first protrusion includes a first flat section configured to be parallel to the first seat, and the second protrusion includes a second flat section configured to be parallel to the second seat.

7. The apparatus of claim 1, further including a first handle attached to the pin and a second handle attached to the catch, wherein:
- the second handle may be manipulated to move the catch from the second depressed position to the second set position, and
- the first handle may be manipulated to move the pin from the extended position to the retracted position.

8. The apparatus of claim 1, wherein the second axis is oriented forward and aft with respect to a chassis and the first protrusion extends forward along the second axis from the pin and the second protrusion extends aft from the pin.

9. A kit capable of being assembled into a latch for a chassis, comprising:
- a pin movable along a first axis between an extended position and a retracted position, the pin being biased toward the extended position, the pin including a first protrusion and a second protrusion;
- a trigger movable along a second axis between a first depressed position and a first set position and biased toward the first set position with a first biasing force, the trigger including a first section, a first seat and a second section;
- a catch movable along the second axis between a second depressed position and a second set position and biased toward the second depressed position with a second biasing force less than the first biasing force, the catch including a second seat and a third seat; and
- a stop for attaching to a rack, wherein, when assembled:
- in a set configuration, the pin is in a disengaged position between the extended and retracted positions and at least partially recessed relative to the catch, the trigger is in the first set position, the first seat abuts the first protrusion thereby preventing the pin from moving to the extended position, the second section abuts the third seat, and the first biasing force overcomes the second biasing force and maintains both the trigger in the first set position and the catch in the second set position;
- in a latched configuration, the pin is in the extended position and extended relative to the catch, the trigger is in the first depressed position, and the catch is in the second depressed position;
- in a released configuration, the pin is in the retracted position, the catch is in the second depressed position, the second protrusion abuts the second seat thereby preventing the pin from moving to the disengaged position;
- the second axis is oriented fore and aft with respect to a chassis and the first protrusion extends forward along the second axis from the pin and the second protrusion extends rearward from the pin; and
- in the latched configuration, the stop abuts the trigger thereby maintaining the trigger in the first depressed position and the stop is positioned between the trigger and the pin such that motion of the pin forward is limited by the stop.

10. The kit of claim 9, wherein:
- in the unlatched configuration, the stop abuts the trigger thereby maintaining the trigger in the first depressed position with the trigger distanced from the catch such that the second section does not abut the third seat.

11. The kit of claim 9, further comprising a first spring for creating the first biasing force, a second spring for creating the second biasing force, and a third spring for biasing the pin toward the extended position.

12. The kit of claim 9, wherein the first protrusion includes a first flat section configured to be parallel to the first seat, and the second protrusion includes a second flat section configured to be parallel to the second seat.

13. The kit of claim 9, further including a first handle capable of being attached to the pin and a second handle capable of being attached to the catch, wherein, when assembled:
- the second handle may be manipulated to move the catch from the second depressed position to the second set position, and
- the first handle may be manipulated to move the pin from the extended position to the retracted position.

14. The apparatus of claim 9, wherein, when assembled, motions of the pin, trigger, and catch include sliding motions.

15. The apparatus of claim 1, wherein, when assembled, the second axis is oriented forward and aft with respect to a chassis and the first protrusion extends forward along the second axis from the pin and the second protrusion extends aft from the pin.

16. A method for securing a chassis within a rack comprising:
providing a chassis with an apparatus including:
1. a pin movable along a first axis between an extended position and a retracted position, the pin being biased toward the extended position, the pin including a first protrusion and a second protrusion;
2. a trigger movable along a second axis between a first depressed position and a first set position and biased toward the first set position with a first biasing force, the trigger including a first section, a first seat and a second section; and
3. a catch movable along the second axis between a second depressed position and a second set position and biased toward the second depressed position with a second biasing force less than the first biasing force, the catch including a second seat and a third seat, wherein:
   a. in a set configuration, the pin is in a disengaged position between the extended and retracted positions and at least partially recessed relative to the catch, the trigger is in the first set position, the first seat abuts the first protrusion thereby preventing the pin from moving to the extended position, the second section abuts the third seat, and the first biasing force overcomes the second biasing force and maintains both the trigger in the first set position and the catch in the second set position;
   b. in a latched configuration, the pin is in the extended position and extended relative to the catch, the trigger is in the first depressed position, and the catch is in the second depressed position;
   c. in a released configuration, the pin is in the retracted position, the catch is in the second depressed position, the second protrusion abuts the second seat thereby preventing the pin from moving to the disengaged position;
   d. the second axis is oriented fore and aft with respect to a chassis and the first protrusion extends forward along the second axis from the pin and the second protrusion extends rearward from the pin; and providing a rack with a stop positioned and dimensioned to fit between the first section of the trigger in the first depressed position and the pin in the extended position;

putting the apparatus in the set configuration;

moving the chassis rearward into the rack until the first section of the trigger contacts the stop; and further sliding the chassis rearward against the stop, causing the trigger to move from the first set position to the first depressed position in which the first seat no longer abuts the first protrusion, and causing the apparatus to transition to the latched configuration such that the pin extends behind the stop and prevents the chassis from being moved forward.

* * * * *